(12) United States Patent
Lee et al.

(10) Patent No.: US 8,853,064 B2
(45) Date of Patent: Oct. 7, 2014

(54) METHOD OF MANUFACTURING SUBSTRATE

(71) Applicant: Lumigntech Co., Ltd., Seoul (KR)

(72) Inventors: Hae Yong Lee, Yongin-si (KR); Young Jun Choi, Seoul (KR); Jin Hun Kim, Seoul (KR); Hyun soo Jang, Yongin-si (KR); Hea Kon Oh, Gwangmyeong-si (KR); Hyun Hee Hwang, Busan (KR)

(73) Assignee: Lumigntech Co., Ltd. (KR)

( * ) Notice: Subject to any disclaimer, the term of this patent is extended or adjusted under 35 U.S.C. 154(b) by 0 days.

(21) Appl. No.: 13/656,734

(22) Filed: Oct. 21, 2012

(65) Prior Publication Data

US 2013/0178049 A1 Jul. 11, 2013

(30) Foreign Application Priority Data

Oct. 21, 2011 (KR) .................. 10-2011-0107973
May 2, 2012 (KR) .................. 10-2012-0046448

(51) Int. Cl.
*H01L 21/20* (2006.01)
*H01L 21/36* (2006.01)
*H01L 21/30* (2006.01)
*H01L 21/46* (2006.01)
*C30B 25/00* (2006.01)
*C30B 25/10* (2006.01)
*H01L 21/02* (2006.01)
*C30B 29/40* (2006.01)
*C30B 25/02* (2006.01)
*C30B 25/18* (2006.01)

(52) U.S. Cl.
CPC .......... *H01L 21/02656* (2013.01); *C30B 25/10* (2013.01); *H01L 21/0254* (2013.01); *C30B 29/403* (2013.01); *H01L 21/02488* (2013.01); *H01L 21/02664* (2013.01); *C30B 25/02* (2013.01); *H01L 21/02002* (2013.01); *C30B 25/183* (2013.01); *H01L 21/0262* (2013.01)

USPC ............. 438/492; 438/478; 438/458; 117/90; 117/95

(58) Field of Classification Search
CPC ............ H01L 21/02656; C30B 29/403; C30B 29/406
USPC ............ 438/458, 478, 479, 604, 492; 117/90, 117/95

See application file for complete search history.

(56) References Cited

U.S. PATENT DOCUMENTS 5,374,581 A * 12/1994 Ichikawa et al. .............. 438/459
6,030,886 A * 2/2000 Yuri et al. ..................... 438/493

(Continued)

FOREIGN PATENT DOCUMENTS

JP 2004055799 A 2/2004
JP 2009007241 A * 1/2009

(Continued)

OTHER PUBLICATIONS

Lee et al. "Self-separated freestanding GaN using a NH4Cl interlayer", Applied Physics Letters, vol. 91, 2007, pp. 192108-1-3.*

(Continued)

*Primary Examiner* — Mary Wilczewski
*Assistant Examiner* — Erik T Peterson

(57) ABSTRACT

The present invention is directed to a method of manufacturing a substrate, which includes loading a base substrate into a reaction furnace; forming a buffer layer on the base substrate; forming a separation layer on the buffer layer; forming a semiconductor layer on the separation layer at least two; and separating the semiconductor layer from the base substrate via the separation layer through natural cooling by unloading the base substrate from the reaction furnace.

3 Claims, 8 Drawing Sheets

(56) References Cited

U.S. PATENT DOCUMENTS

| | | | |
|---|---|---|---|
| 6,176,925 B1* | 1/2001 | Solomon et al. | 117/89 |
| 6,274,518 B1* | 8/2001 | Yuri et al. | 438/791 |
| 6,303,405 B1* | 10/2001 | Yoshida et al. | 438/46 |
| 6,528,394 B1* | 3/2003 | Lee | 438/478 |
| 6,562,701 B2* | 5/2003 | Ishida et al. | 438/479 |
| 6,586,778 B2* | 7/2003 | Linthicum et al. | 257/103 |
| 6,673,149 B1* | 1/2004 | Solomon et al. | 117/90 |
| 6,864,158 B2* | 3/2005 | Ishida | 438/479 |
| 6,924,159 B2* | 8/2005 | Usui et al. | 438/22 |
| 6,964,914 B2* | 11/2005 | Ghyselen et al. | 438/458 |
| 7,407,865 B2* | 8/2008 | Park | 438/442 |
| 7,407,869 B2* | 8/2008 | Ghyselen et al. | 438/458 |
| 7,462,893 B2* | 12/2008 | Han et al. | 257/200 |
| 7,621,998 B2* | 11/2009 | Lee et al. | 117/84 |
| 7,723,217 B2* | 5/2010 | Lee et al. | 438/483 |
| 7,790,489 B2* | 9/2010 | Shibata | 438/46 |
| 7,998,272 B2* | 8/2011 | Song | 117/81 |
| 8,142,566 B2* | 3/2012 | Kiyomi et al. | 117/93 |
| 8,404,045 B2* | 3/2013 | Kuraoka et al. | 117/90 |
| 2002/0102830 A1* | 8/2002 | Ishida | 438/604 |
| 2002/0137342 A1* | 9/2002 | Ishida et al. | 438/689 |
| 2005/0247260 A1* | 11/2005 | Shin et al. | 117/88 |
| 2006/0151797 A1* | 7/2006 | Park | 257/86 |
| 2007/0082465 A1* | 4/2007 | Song et al. | 438/478 |
| 2007/0085163 A1* | 4/2007 | Lee et al. | 257/499 |
| 2009/0166896 A1* | 7/2009 | Yamazaki et al. | 257/787 |
| 2009/0181525 A1* | 7/2009 | Park | 438/509 |
| 2009/0278136 A1* | 11/2009 | Beaumont et al. | 257/76 |
| 2010/0001289 A1* | 1/2010 | Frayssinet et al. | 257/76 |
| 2011/0101307 A1* | 5/2011 | Lee et al. | 257/22 |

FOREIGN PATENT DOCUMENTS

| | | |
|---|---|---|
| KR | 20070038846 A | 4/2007 |
| KR | 20100024944 A | 3/2010 |
| WO | WO 2008146699 A1 * | 12/2008 |

OTHER PUBLICATIONS

Lee et al. "Growth of self-standing GaN substrates", Proc. of SPIE, vol. 7602, 2010, pp. 760202-1-8.*

* cited by examiner

FIG. 3
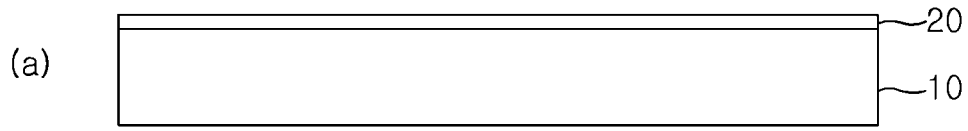
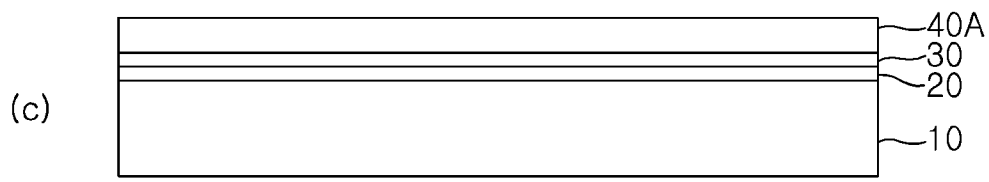
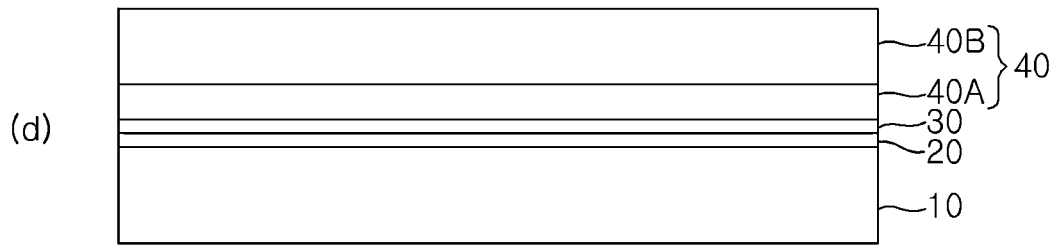
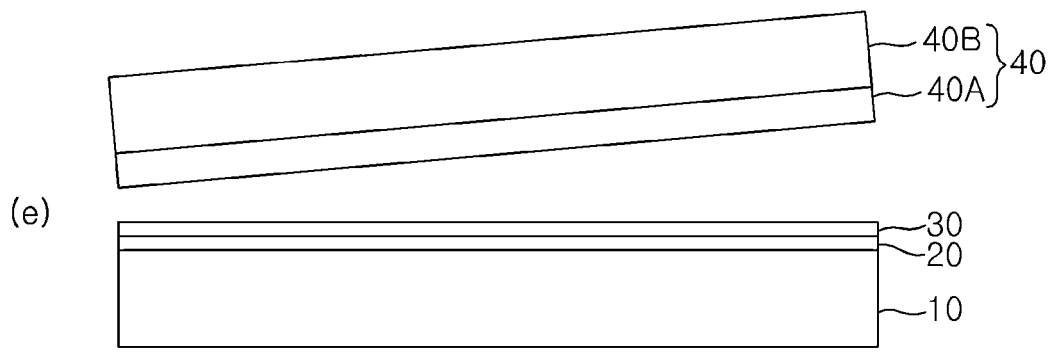

FIG. 6
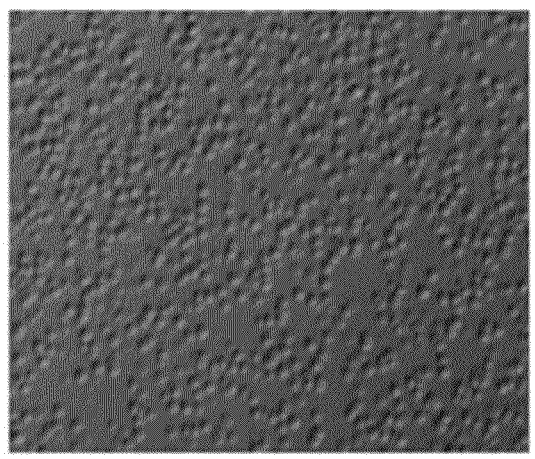
(a)
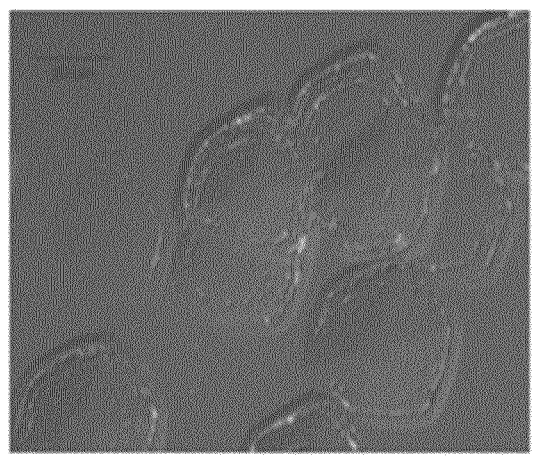
(b)
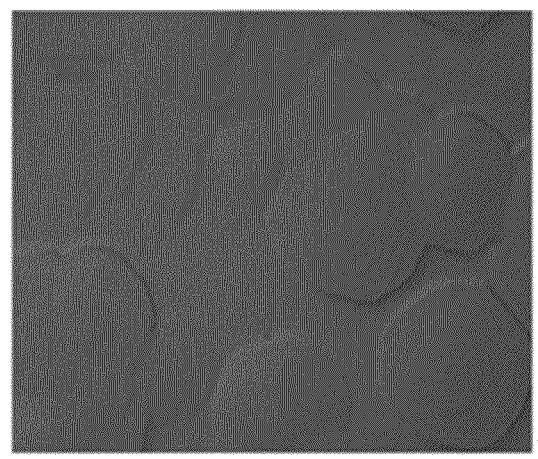
(c)
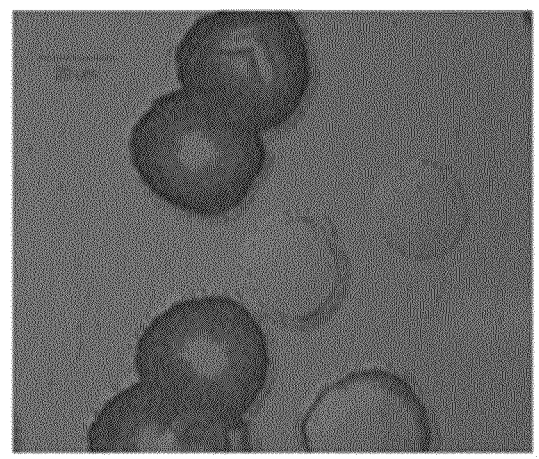
(d)

FIG. 8
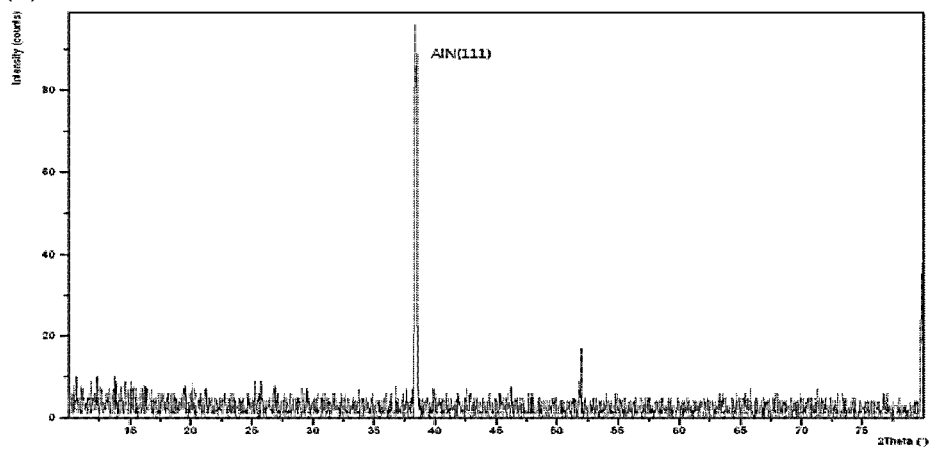
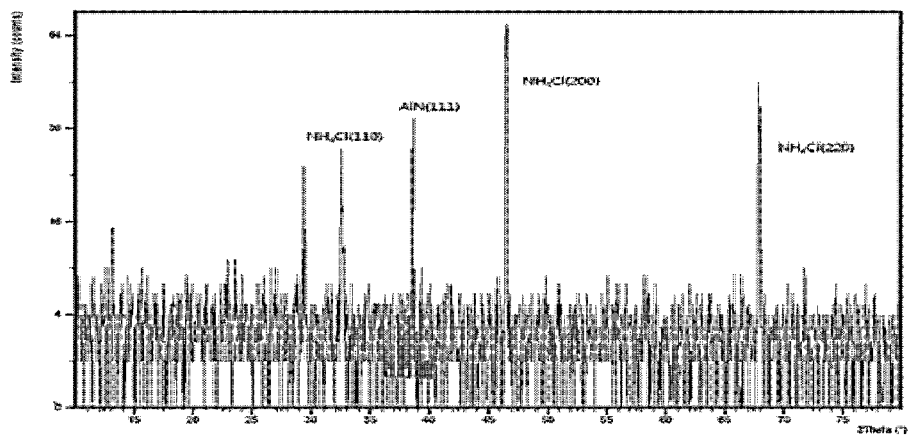

METHOD OF MANUFACTURING SUBSTRATE

This application claims priority to Korean Patent Application Nos. 10-2011-0107973 filed on Oct. 21, 2011 and 10-2012-0046448 filed on May 2, 2012 and all the benefits accruing therefrom under 35 U.S.C. 119, the contents of which are herein incorporated by reference in its entirety.

BACKGROUND OF THE INVENTION

1. Field of the Invention

The present invention relates to a method of manufacturing a substrate, and more particularly, to a method of manufacturing a Group III-V compound semiconductor substrate.

2. Description of the Related Art

A semiconductor device is an electronic component in which electronic devices such as a power device, a light emitting device and a light receiving device are implemented on a predetermined substrate using a semiconductor process technology. For example, the power device has a transistor, a metal-oxide-semiconductor field-effect transistor (MOSFET), an insulated gate bipolar transistor (IGBT) and a schottky diode implemented on a substrate, and the light receiving device has a solar cell and a photo sensor implemented on a substrate. Particularly, a semiconductor light emitting device using a GaN-based compound semiconductor can emit blue light, thereby realizing full colors together with existing green and red light emitting devices using GaAs- and InP-based compound semiconductors. Thus, the semiconductor light emitting device using the GaN-based compound semiconductor has come into the spotlight as a light source of various displays.

However, a high-quality GaN single crystal substrate having the same lattice constant and thermal expansion coefficient is required in order to grow a high-quality GaN thin film. Since GaN has a melting point of approximately 2400° C., and partial pressure of Group V nitrogen is much greater than that of Group III elements, nitrogen requires a pressure of approximately 40,000 atm so as to grow a single crystal substrate. It is difficult to grow the GaN single crystal using the current technique of growing a semiconductor single crystal such as Si, GaAs, or InP.

Thus, a heterogeneous substrate such as sapphire ($Al_2O_3$) having a large mismatch with GaN in lattice constant and thermal expansion coefficient is currently used, and a heteroepitaxy in which a GaN epitaxial layer is grown using a buffer layer such as AlN or GaN is used to reduce the mismatch.

Various methods are proposed to grow the high-quality GaN single crystal and may be classified into two methods: a method of growing a GaN layer on a heterogeneous substrate and separating the GaN substrate from the heterogeneous substrate using laser lift-off, wet etching, or the like, and a method of growing a GaN layer on a heterogeneous substrate and then cooling them to automatically separate the GaN substrate and the heterogeneous substrate from each other.

As examples of the first method, U.S. Pat. No. 6,440,823 has disclosed a method of growing a GaN layer with low defect on a sapphire substrate using a hybrid vapor phase epitaxy (HVPE) growth method and then separating the sapphire substrate using laser lift-off, and U.S. Pat. No. 6,693,201 has disclosed a method of growing a GaN layer on a GaAs substrate and removing the GaAs substrate using the wet etching.

As examples of the second method, U.S. Pat. No. 6,924,159 has disclosed an automatic separation method in which a thin GaN layer is grown on a heterogeneous substrate, a thin Ti layer is then grown on the GaN layer, a void is formed in the thin GaN layer under the Ti layer by heat treatment under a hydrogen atmosphere, and a thick GaN layer is formed on the thin GaN layer so that a GaN substrate is automatically separated from the heterogeneous substrate by cooling. Also, U.S. Patent Publication No. 2009/0278136 has disclosed a method in which H+ ions are injected into an ELO GaN template on a heterogeneous substrate using metal oxide chemical vapor deposition (MOCVD), a weak layer is formed at a low temperature, a high-quality thick GaN layer is grown at a high temperature, and then the weak layer is automatically separated by cooling.

However, the related art automatic separation method described above has a low yield and high manufacturing cost.

SUMMARY OF THE INVENTION

The present invention is to provide a method of manufacturing a substrate, which can reduce manufacturing cost and improve productivity by simplifying a manufacturing process.

The present invention is to provide a method of manufacturing a substrate that has excellent surface property and crystallinity and can be used in manufacturing a high-performance semiconductor device.

According to an aspect of the present invention, there is provided a method of manufacturing a substrate, including: raising temperature of a base substrate; forming a buffer layer on the base substrate; forming a separation layer on the buffer layer; forming a semiconductor layer on the separation layer at least two temperatures; and separating the semiconductor layer from the base substrate via the separation layer by cooling the base substrate.

The buffer layer may be formed using a first source gas including a Group V element.

The buffer layer may be formed by nitriding the base substrate using $NH_3$ gas.

The separation layer may be formed at a first temperature using the first source gas and a second source gas.

The second source gas may be a gas containing chlorine (Cl).

The separation layer may be formed of $NH_4Cl$ using $NH_3$ and HCl.

The semiconductor layer may be formed using a material containing a Group III element, a third source gas formed by the second source gas, and the first source gas.

The semiconductor layer may include a GaN layer formed through a reaction between GaCl and $NH_3$ using Ga and HCl.

A portion of the thickness of the semiconductor layer may be formed at the first temperature, and the rest of the thickness of the semiconductor layer may be formed at a temperature higher than the first temperature.

According to another aspect of the present invention, there is provided a method of manufacturing a substrate, including: raising temperature of a base substrate; forming a plurality of recessed portions by etching the base substrate; forming a buffer layer on the base substrate; forming a separation layer on the buffer layer; forming a semiconductor layer on the separation layer at least two temperatures; and separating the semiconductor layer from the base substrate via the separation layer by cooling the base substrate.

The plurality of recessed portions may be formed by supplying a second source gas to a reaction furnace.

The buffer layer may be formed using a first source gas containing a Group V element.

The separation layer may be formed at a first temperature using the first source gas and the second source gas.

The semiconductor layer may be formed using a material containing a Group III element, a third source gas formed by the first source gas, and the second source gas.

A portion of the thickness of the semiconductor layer may be formed at the first temperature, and the rest of the thickness of the semiconductor layer may be formed at a temperature higher than the first temperature.

BRIEF DESCRIPTION OF THE DRAWINGS

Preferred embodiments of the present invention can be understood in more detail from the following description taken in conjunction with the accompanying drawings, in which:

FIG. 3 shows sectional views sequentially illustrating processes of the method of manufacturing a substrate according to the embodiment of the present invention;

FIG. 6 shows scanning electron microscope (SEM) photographs showing substrate surfaces in the respective processes of the method according to the embodiment of the present invention;

FIGS. 8 and 9 show X-ray diffraction (XRD) measurement data after the respective processes are performed in the method according to the embodiment of the present invention.

DETAILED DESCRIPTION OF THE INVENTION

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art.

Figure 1:
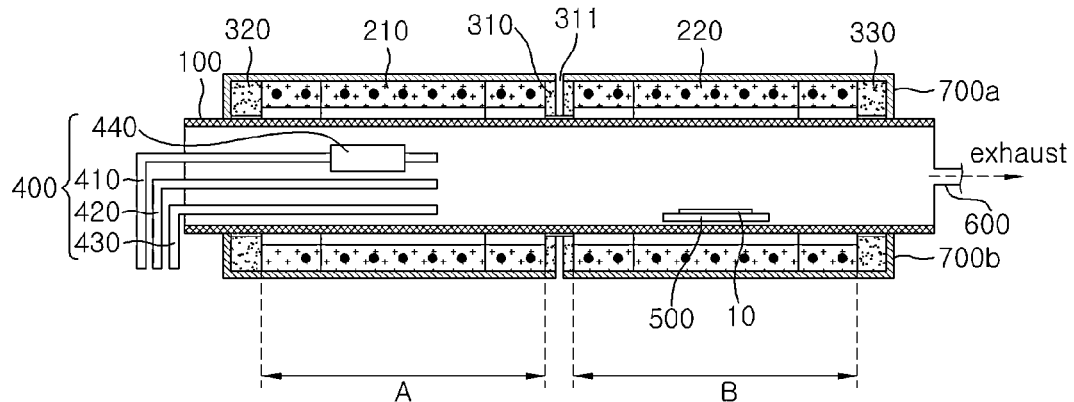
FIG. 1 is a schematic sectional view of a thin film growth apparatus used in the present invention.
Figure 2:
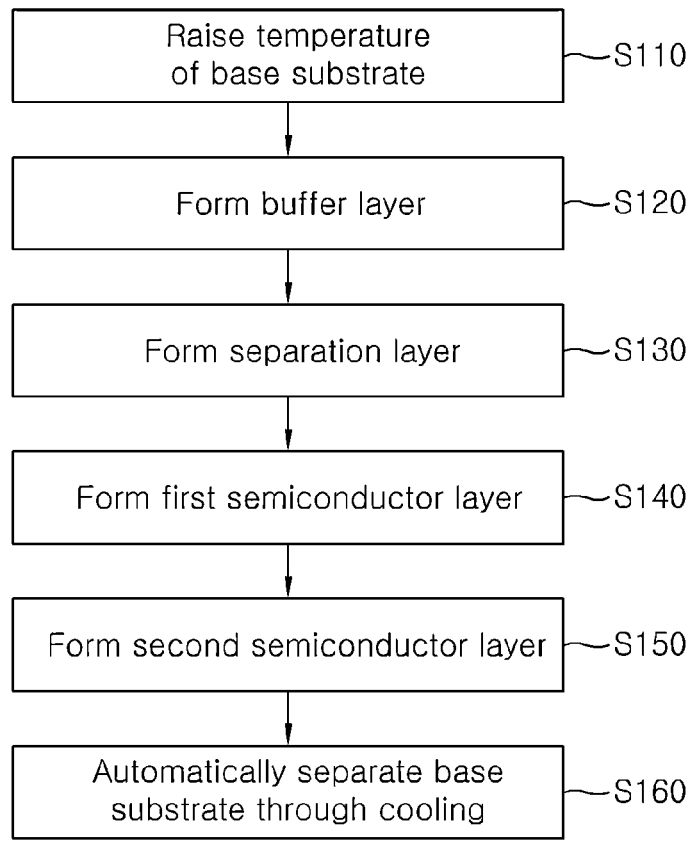
FIG. 2 is a process flowchart illustrating a method of manufacturing a substrate according to one embodiment of the present invention.

FIG. 1 is a schematic sectional view of a thin film growth apparatus used in the present invention; FIG. 2 is a process flowchart illustrating a method of manufacturing a substrate according to one embodiment of the present invention; and FIG. 3 shows sectional views sequentially illustrating processes of the method of manufacturing a substrate according to the embodiment of the present invention.

A method according to the embodiment of the present invention illustrates a case where a nitride semiconductor layer is formed on a base substrate, and then, the base substrate and the nitride semiconductor layer are automatically separated from each other in cooling of the base substrate. In the present invention, a hybrid vapor phase epitaxy (HVPE) apparatus may be used as the thin film growth apparatus. The HVPE apparatus includes a reaction tube formed in a furnace capable of independently adjusting a temperature for each section, and the reaction tube may have therein a source zone which is supplied with a source gas for growing a nitride layer in the reaction tube and a reaction zone in which the nitride layer is grown through reaction of the source gas. For example, as shown in FIG. 1, the thin film growth apparatus may include a reaction tube 100 having a source zone A and a reaction zone B provided therein, a source zone heating unit 210 provided in an outer circumference of the reaction tube 100 to heat the source zone A, a reaction zone heating unit 220 provided in the outer circumference of the reaction tube 100 to heat the reaction zone B, a source supply unit 400 for supplying a source material to the source zone A, and an insulation member 310 disposed between the source and reaction zone heating units 210 and 220 to reduce thermal interference between the two zones.

The reaction tube 100 is formed in the shape of a hollow tube. Thus, the source zone A supplied with a source material is provided in one space of the reaction tube 100, and the reaction zone B in which a layer is grown on a substrate G is provided in the other space connected to the source zone A.

The source zone heating unit 210 for heating the source zone A and the reaction zone heating unit 220 for heating the reaction zone B are disposed on the outer circumference of the reaction tube 100 so that they are spaced apart from each other at a predetermined distance. At this time, the source and reaction zone heating units 210 and 220 may be formed in the shape of a core heater or plate heater so as to surround the entire or at least a portion of the outer circumference of the reaction tube 100. For example, the core heater may be wound in a spring shape around the outer circumference of the reaction tube 100, or may be disposed in an S-shape along the outer circumference of the reaction tube 100. Also, each of the source and reaction zone heating units 210 and 220 may includes a plurality of subunits so as to subdivide and heat the source and reaction zones A and B. Accordingly, it is possible to minutely and independently control temperature distribution and heating condition for the subdivided zones.

The source supply unit 400 for supplying a deposition source material from the outside of the reaction tube 100 is disposed in the source zone A. The source supply unit 400 may be variously selected according to the kind of layer to be grown on the base substrate 10. For example, the source supply unit 400 may be configured to form a Group III-V p-type semiconductor layer. To this end, the source supply unit 400 includes first, second and third gas supply pipes 410, 420 and 430 installed to one side of the reaction tube 100 in which a low-pressure or vacuum state is maintained, and a crucible 440 which is mounted in the middle of the first gas supply tube 410 to containing a source material, e.g., a Group III element such as Ga and a p-type dopant such as Mg. The first gas supply pipe 410 may supply HCl gas for forming GaCl through a reaction with Ga so as to form a nitride layer, e.g., a GaN layer. The second gas supply pipe 420 may supply a source gas containing a Group V element such as $NH_3$ gas, which reacts with GaCl supplied from the first gas supply pipe 410 so as to form the GaN layer. Also, the third gas supply pipe 430 may supply gas, e.g., HCl gas for etching the base substrate. That is, HCl gas may be supplied through different paths. That is, the HCl gas may be supplied through the third gas supply pipe 430 when the base substrate is etched and through the first gas supply pipe 410 when the GaN layer is grown. Meanwhile, the source gas supplied to the first, second and third gas supply pipes 410, 420 and 430 may be supplied together with a carrier gas, e.g., an inert gas such as $N_2$, $H_2$ or Ar.

A substrate support platform 500 on which the base substrate 10 may be mounted is installed in the reaction zone B, and an exhaust unit 600 for exhausting the inside of the reaction tube 100 is connected to one side of the reaction zone B.

For example, in a case where the GaN layer is formed using the thin film growth apparatus, Ga is provided in the crucible 440, and the HCl gas is supplied to the first gas supply pipe 410 connected to the crucible 440, thereby forming GaCl gas downstream of the first gas supply pipe 410. Then, NH$_3$ gas is supplied through the second gas supply pipe 420, thereby forming the GaN layer through a reaction between GaCl and NH$_3$ as shown in the following reaction formula:

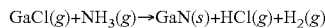

The method using the thin film growth apparatus according to the embodiment of the present invention, as shown in FIGS. 2 and 3, includes raising a base substrate to a predetermined temperature (S110), forming a buffer layer on the base substrate (S120), forming a separation layer on the buffer layer (S130), growing a first semiconductor layer on the separation layer (S140), growing a second semiconductor layer on the first semiconductor layer to form a semiconductor layer composed of the first and second semiconductor layers (S150), and automatically separating the semiconductor layer from the base substrate through cooling of the base substrate to manufacture a semiconductor substrate (S160). Hereinafter, the method according to the embodiment of the present invention will be described in detail.

First, the temperature of a base substrate 10 is raised by loading the base substrate 10 into the reaction zone B of the reaction tube 100, which is maintained at a high temperature (S110). Here, the reaction zone B may be maintained at a temperature of 950 to 1050° C. The base substrate 10 may also include all kinds of substrates, such as a sapphire substrate, a silicon carbide (SiC) substrate, an aluminum nitride (AlN) substrate and a zinc oxide (ZnO) substrate, on which a semiconductor layer can be deposited. In this embodiment, a sapphire substrate is used as the base substrate 10.

Then, as shown in FIG. 3(a), a buffer layer 20 is formed on the base substrate 10 by nitriding the base substrate 10 as a substrate preprocessing process (S120). NH$_3$ gas is supplied to the reaction region B through the second gas supply pipe 420 so as to nitride the base substrate 10. At this time, the time taken to nitride the base substrate 10 may be about 1 to 20 minutes. The buffer layer 20 may be formed of various materials according to the kind of the base substrate 10. For example, the buffer layer 20 may be formed using the sapphire substrate.

Subsequently, as shown in FIG. 3(b), a separation layer 30 is formed on the buffer layer 20 at a low temperature by lowering the temperature of the reaction zone B of the reaction tube 100 (S130). For example, an NH$_4$Cl layer may be formed as the separation layer 30. In order to form the NH$_4$Cl layer, NH$_3$ gas is supplied through the second gas supply pipe 420, and HCl gas is supplied through the third gas supply pipe 430. That is, the NH$_4$Cl layer is formed through the reaction between NH$_3$ and HCl. At this time, the reaction zone B is maintained at a temperature of 350 to 450° C., and the gases may be supplied for about 1 to 20 minutes.

Subsequently, as shown in FIG. 3(c), a first semiconductor layer 40A is continuously formed on the separation layer 30 (S140). The first semiconductor layer 40A may be formed of various materials, for example GaN and the like. To form the GaN layer, GaCl gas is supplied to the reaction zone B of the reaction tube 100 by providing Ga in the crucible 440 and supplying the HCl gas thereto through the first gas supply pipe 410, and the NH$_3$ gas is then supplied to the reaction zone B through the second gas supply pipe 420. Thus, the GaN layer is grown through a reaction between GaCl and NH$_3$. At this time, a portion of the thickness of the first semiconductor layer 40A may be grown at the same temperature as the growth temperature of the separation layer 30 in the early growth stage, and the rest of the thickness of the first semiconductor layer 40A may be then grown by gradually raising the temperature. In addition, the thickness of the first semiconductor layer 40A may be partially grown by gradually raising the temperature, and the rest of the thickness of the semiconductor layer 40A may be then grown by being maintained at a predetermined temperature. For example, after the first semiconductor layer 40A is partially grown by performing a process at a temperature of 350 to 450° C. for about 1 to 10 minutes, the first semiconductor layer 40A may be grown to have a thickness of some micrometers to some tens of micrometers by gradually raising the reaction zone B, e.g., to a temperature of 800 to 900° C., during the growth of the first semiconductor layer 40A and then maintaining the temperature of the reaction zone B at a certain temperature. As such, the thickness of the first semiconductor layer 40A is partially grown at the growth temperature of the separation layer 30, so that it is possible to prevent vaporization of the separation layer 30 which is in a powder state. That is, if the separation layer 30 is grown at a low temperature and the first semiconductor layer 40A is grown at a high temperature greater that the low temperature, the separation layer 30 may be removed by being vaporized. Further, the rest of the thickness of the first semiconductor layer 40A is grown by raising the temperature of the reaction zone B, so that it is possible to prevent cracks from occurring in the first semiconductor layer 40A when a second semiconductor layer 40B is grown in a subsequent process. That is, if the first semiconductor layer 40A is fully grown at the growth temperature of the separation layer 30 and then the second semiconductor layer 40B is grown at a high temperature, cracks may occur in the first semiconductor layer 40A due to the temperature difference.

Next, as shown in FIG. 3(d), a second semiconductor layer 40B is grown on the first semiconductor layer 40A by raising the temperature of the reaction zone B of the reaction tube 100 while continuously supplying the NH$_3$ gas (S150). The second semiconductor layer 40B may be formed of the same material as the semiconductor layer 40A. For example, the second semiconductor layer 40B may be formed of GaN. To grow a high-quality semiconductor layer 40, the second semiconductor layer 40B is grown, for example, to some hundreds of micrometers to some millimeters at a high temperature of approximately 980 to 1,080° C. Thus, the semiconductor layer 40 composed of the first and second semiconductor layers 40A and 40B is formed. That is, a portion of the thickness of the semiconductor layer 40 is grown at a low temperature (the first semiconductor layer 40A), and the rest of the thickness of the semiconductor layer 40 is grown at a high temperature (the second semiconductor layer 40B). Accordingly, it is possible to prevent vaporization of the separation layer 30 and to form a high-quality semiconductor layer 40.

Subsequently, if the base substrate 10, on which the semiconductor layer 40 having a thickness of some hundreds of micrometers to some millimeters is formed, is unloaded from the reaction furnace, the semiconductor layer 40 is automatically separated from the base substrate 10, as shown in FIG. 3(e), due to a difference in thermal expansion coefficient between the base substrate 10 and the semiconductor layer 40 when the base substrate 10 and the semiconductor layer 40 are cooled down (S160). That is, the weak separation layer 30 provided between the semiconductor layer 40 and the base substrate 10 is separated so that the semiconductor layer 40 is automatically separated from the base substrate 10. Accordingly, the semiconductor substrate is manufactured.

As described above, in the method according to the embodiment of the present invention, the buffer layer 20 and the separation layer 30 are formed on the base substrate 10, the semiconductor layer 40 is formed on the separation layer 30 at low and high temperatures, and the separation layer 30 is then separated due to the difference in thermal expansion coefficient through natural cooling by unloading the base substrate 10 having the semiconductor layer 40 formed thereon, so that the semiconductor layer 40 is automatically separated from the base substrate 10. That is, the separation layer 30 with weak crystallization is formed between the semiconductor layer 40 and the base substrate 10, so that the semiconductor layer 40 can be more easily separated from the base substrate 10. Further, since the buffer layer 20, the separation layer 30 and the semiconductor layer 40 are formed in-situ on the base substrate 10 in one reaction apparatus, the manufacturing process can be simplified, and accordingly, productivity can be improved.

Figure 4:
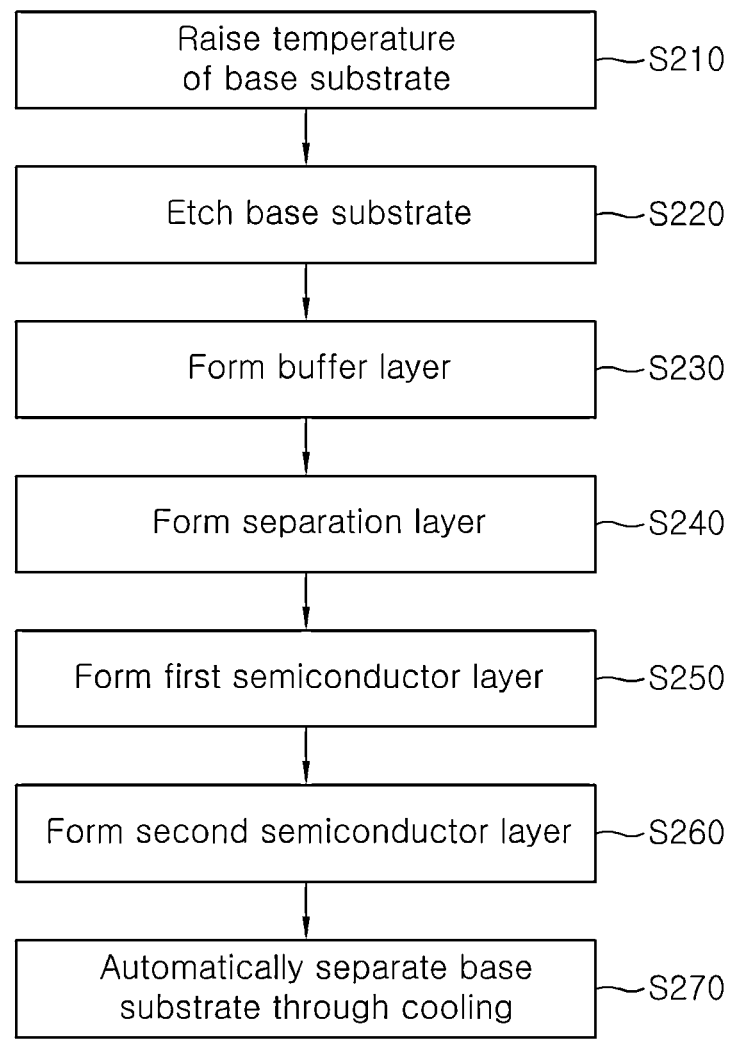
FIG. 4 is a process flowchart illustrating a method of manufacturing a substrate according to another embodiment of the present invention.
Figure 5:
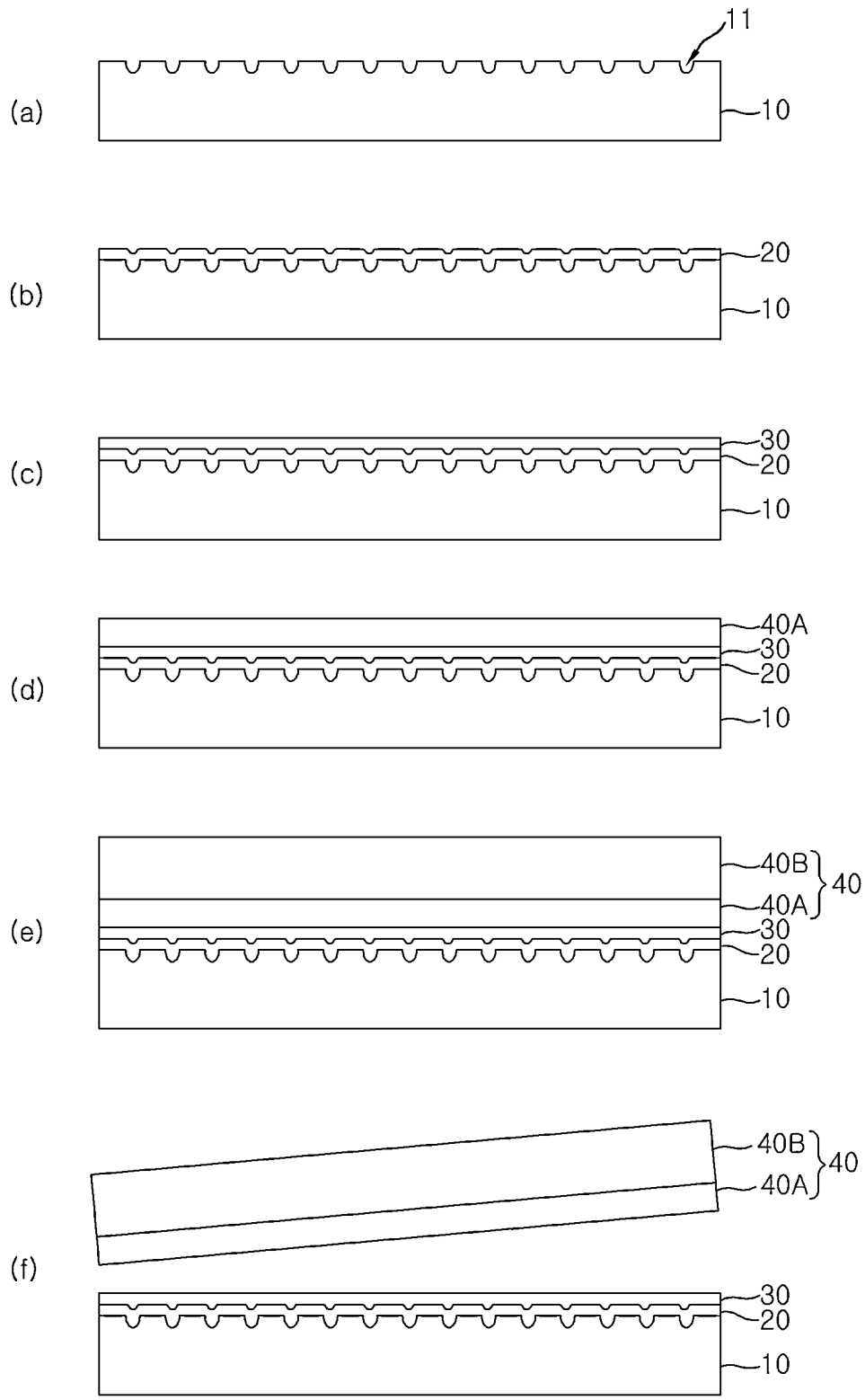
FIG. 5 shows sectional views sequentially illustrating processes of the method of manufacturing a substrate according to the other embodiment of the present invention.
Figure 7:
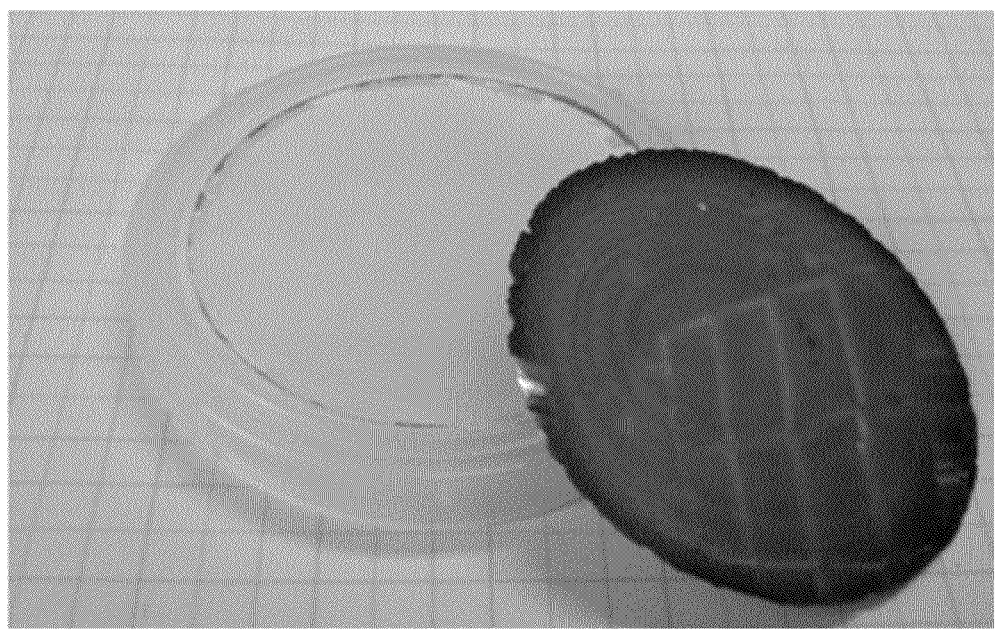
FIG. 7 is a photograph showing a free-standing GaN substrate and a sapphire substrate, which are automatically separated from each other, in the method according to the embodiment of the present invention.
Figure 9:
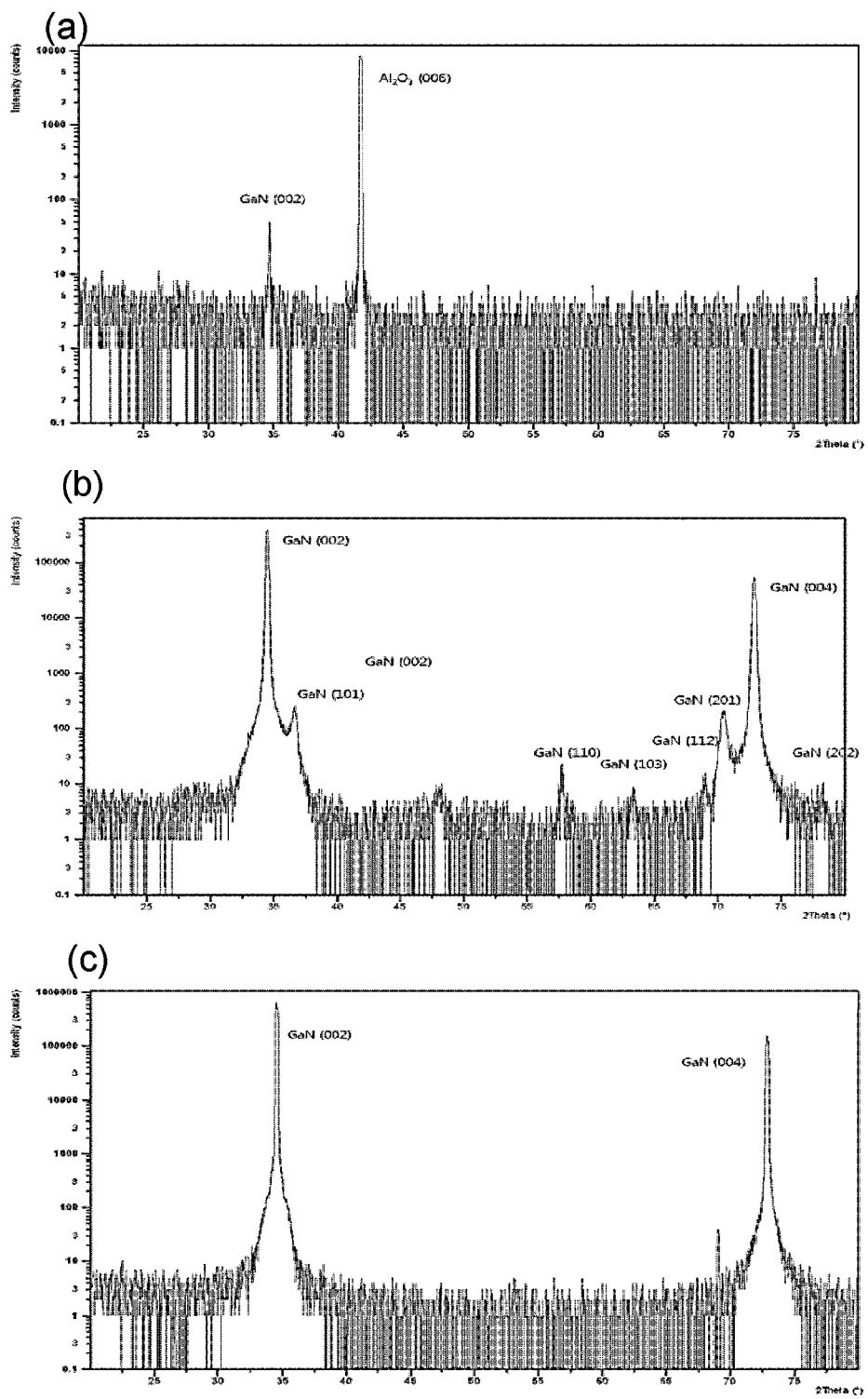

FIG. 4 is a process flowchart illustrating a method of manufacturing a substrate according to another embodiment of the present invention; and FIG. 5 shows sectional views sequentially illustrating processes of the method. FIG. 6 is a scanning electron microscope (SEM) photograph showing a substrate surface in the respective processes of the method. FIG. 7 is an SEM photograph showing a semiconductor layer automatically separated from a base substrate. FIGS. 8 and 9 are graphs showing X-ray diffraction (XRD) measurement data after the respective processes are performed in the method according to another embodiment of the present invention.

The method according to the embodiment of the present invention, as shown in FIGS. 4 and 5, includes raising a base substrate to a predetermined temperature (S210), etching the base substrate (S220), forming a buffer layer on the base substrate (S230), forming a separation layer on the buffer layer (S240), forming a first semiconductor layer on the separation layer (S250), growing a second semiconductor layer on the first semiconductor layer to form a semiconductor layer composed of the first and second semiconductor layers (S26), and automatically separating the semiconductor layer from the base substrate through cooling of the base substrate to manufacture a semiconductor substrate (S270). That is, in this embodiment, the base substrate is etched before the buffer layer is formed. Hereinafter, the method according to the embodiment of the present invention will be described in detail.

First, the temperature of a base substrate 10 is raised by loading the base substrate 10 into the reaction zone B of the reaction tube 100, which is maintained, for example, at a temperature of 950 to 1,050° C. (S210).

Then, as shown in FIG. 5(a), recessed portions 11 are formed in the base substrate 10 by etching the base substrate 10 as a preprocessing process of the base substrate 10 (S220). To this end, the base substrate 10 may be etched by supplying HCl gas to the reaction zone B through an HCl gas supply pipe for supplying GaCl, i.e., the third gas supply pipe 430 configured separately from first gas supply pipe 410. The etching process of the base substrate 10 may be performed for approximately 1 to 20 minutes. Since the base substrate 10, e.g., sapphire substrate has crystals in a hexagonal shape, a plurality of circular recessed portions 11 are formed in a surface of the sapphire substrate as shown in FIG. 5(a). Accordingly, the surface of the base substrate 10 is roughened with a surface roughness (Ra) of 10 to 300 Å, more preferably 14 to 110 Å. FIG. 6(a) is an SEM photograph (magnification of 100 times) of a surface of the sapphire substrate after the sapphire substrate is etched, which shows a state in which circular recessed portions are formed by etching the surface of the sapphire substrate. If the recessed portions 11 are formed in the base substrate 10, the surface sectional area of the base substrate 10 increases, so that a buffer layer and a separation layer can be more easily formed in subsequent processes.

Subsequently, as shown in FIG. 5(b), a buffer layer 20 is formed on the base substrate 10 by nitriding the base substrate 10 as a substrate preprocessing process (S230). To nitride the base substrate 10, the supply of HCl through the third gas supply pipe 430 is stopped, and $NH_3$ gas is supplied to the reaction zone B through the second gas supply pipe 420. For example, a buffer layer 20 is formed of AlN using the sapphire substrate. FIG. 6(b) is an SEM photograph (magnification of 500 times) of a surface of the sapphire substrate after the sapphire substrate is nitrided. FIG. 8(a) shows X-ray diffraction (XRD) measurement data of the sapphire substrate after the sapphire substrate is nitrided. As shown in these figures, an AlN layer is formed by nitriding the sapphire substrate.

Next, as shown in FIG. 5(c), a separation layer 30 is formed on the buffer layer 20 at a low temperature by lowering the temperature of the reaction zone B of the reaction tube 100 (S240). The separation layer 30 may be formed, for example, of $NH_4Cl$. To this end, $NH_3$ gas is supplied through the second gas supply pipe 420, and HCl is supplied through the third gas supply pipe 430. At this time, the reaction zone B is maintained at a temperature of 350 to 450° C., and gas may be supplied to the reaction zone B for about 1 to 20 minutes. FIG. 6(c) is an SEM photograph (magnification of 500 times) of a surface of the sapphire substrate after the $NH_4Cl$ layer is formed. FIG. 8(b) shows XRD measurement data after the $NH_4Cl$ layer is formed, which shows an $NH_4Cl$ layer formed on the AlN layer.

Subsequently, as shown in FIG. 5(d), a first semiconductor layer 40A is continuously formed on the separation layer 30 (S250). The first semiconductor layer 40A may be formed of GaN. To this end, GaCl gas is supplied to the reaction zone B of the reaction tube 100 by providing Ga in the crucible 440 and supplying the HCl gas to the crucible 440 through the first gas supply pipe 410, and the $NH_3$ gas is supplied to the reaction zone B through the second gas supply pipe 420. In addition, the first semiconductor layer 40A may be grown by raising the temperature of the reaction zone B. For example, the first semiconductor layer 40A may be grown by performing a process at a temperature of 350 to 450° C. for about 1 to 10 minutes, and the first semiconductor layer 40A may be grown by gradually raising the temperature of the reaction zone B, e.g., to 800 to 900° C., during the growth of the first semiconductor layer 40A while performing consecutive growth. In addition, the first semiconductor layer 40A may be grown to have a thickness of some micrometers to some tens of micrometers by raising the temperature of the reaction zone B, e.g., to 800 to 900° C., during the growth of the first semiconductor layer 40A, and then maintaining the temperature of the reaction zone B at a certain temperature. FIG. 6(d) is an SEM photograph (magnification of 500 times) of a surface of the substrate after a low-temperature GaN layer is grown.

Subsequently, as shown in FIG. 3(d), a second semiconductor layer 40B is grown on the first semiconductor layer 40A by raising the temperature of the reaction zone B of the reaction tube 100 while continuously supplying the NH$_3$ gas (S260). The second semiconductor layer 40B may be formed of the same material as the semiconductor layer 40A. For example, the second semiconductor layer 40B may be formed of a GaN layer. To grow a high-quality semiconductor layer 40, the second semiconductor layer 40B is grown, for example, to some hundreds of micrometers to some millimeters at a high temperature of approximately 980 to 1,080° C. Thus, the semiconductor layer 40 composed of the first and second semiconductor layers 40A and 40B is formed.

Then, if the base substrate 10, on which the semiconductor layer 40 having a thickness of some hundreds of micrometers to some millimeters is formed, is unloaded from the reaction furnace, the semiconductor layer 40 is automatically separated from the base substrate 10, as shown in FIG. 5(f), due to a difference in thermal expansion coefficient between the base substrate 10 and the semiconductor layer 40 when the base substrate 10 and the semiconductor layer 40 are cooled down (S270). That is, the semiconductor layer 40 is automatically separated from the separation layer 30 thereunder. Thus, a semiconductor substrate is manufactured. FIG. 7 is a photograph showing a sapphire substrate (a substrate placed on a 2-inch carrier) and a free-standing GaN substrate (a substrate erected diagonally), which are automatically separated from each other. FIG. 9(a) shows XRD measurement data on the separated surface of the sapphire substrate, in which the main peak of the sapphire substrate and the main peak of GaN remaining on the surface thereof were slightly observed. FIG. 9(b) shows XRD measurement data on an N-face of the separated GaN substrate, i.e., a surface attached to the sapphire substrate, which shows a result that the N-face is disposed not in the c-axis direction but the other axes to be grown. FIG. 9(c) shows XRD measurement data on a Ga-face of the separated Ga growth substrate, i.e., a result that a GaN growth surface is well grown as a single crystal disposed in the c-axis.

As described above, in the method according to the embodiment of the present invention, the recessed portions 11 are formed by etching the base substrate 10, the buffer layer 20, the separation layer 30 and the semiconductor layer 40 are formed in-situ using one reaction apparatus, and the semiconductor layer 40 is automatically separated from the base substrate 10 through natural cooling in the unloading of the base substrate 10. However, in the etching process of the base substrate 10 for forming the recessed portions 11, the surface of the substrate may be etched by increasing the Ph concentration of chemical mechanical polishing (CMP) slurry in a CMP process for polishing the surface of the sapphire substrate, or the recessed portions 11 may be formed by immersing the sapphire substrate in KOH molten salt having a temperature of 400 to 550° C., e.g., by etching the sapphire substrate for 5 to 10 minutes. That is, the substrate etching process may be performed using any one of a dry etching using HCl gas, a wet etching using KOH molten salt and a CMP process of increasing the concentration of slurry. In a case where the recessed portion 11 are formed using the wet etching or CMP process, a thin-film growth process may be performed after the base substrate 10 having the recessed portions 11 formed therein is loaded into the thin film growth apparatus.

According to the present invention, a buffer layer and a separation layer are formed on a base substrate, a semiconductor layer is formed on the separation layer at low and high temperatures, and then the semiconductor layer is automatically separated from the base substrate due to the difference in thermal expansion coefficient through natural cooling by unloading the base substrate having the semiconductor layer formed thereon. That is, a weak separation layer is formed between the semiconductor layer and the base substrate, so that the semiconductor layer can be more easily separated from the base substrate. Further, since the buffer layer, the separation layer and the semiconductor layer are formed in-situ using one reaction apparatus, the manufacturing process can be simplified, and accordingly, productivity can be improved.

Although the present invention has been described in connection with the preferred embodiments, the embodiments of the present invention are only for illustrative purposes and should not be construed as limiting the scope of the present invention. It will be understood by those skilled in the art that various changes and modifications can be made thereto within the technical spirit and scope defined by the appended claims.

What is claimed is:

1. A method of manufacturing a substrate, comprising:
   raising temperature of a base substrate;
   forming a plurality of recessed portions conforming to crystal shapes of the base substrate on a surface of the base substrate by supplying HCl gas on the base substrate;
   forming a buffer layer on the base substrate;
   forming a NH$_4$Cl separation layer by supplying HCl gas and NH$_3$ gas on the buffer layer;
   forming a first semiconductor layer on the separation layer at a temperature in the range of 350° C. to 450° C.;
   forming a second semiconductor layer on the first semiconductor layer at a temperature higher than the temperature that the first semiconductor layer is formed; and
   separating the semiconductor layer from the base substrate via the separation layer by cooling the base substrate,
   wherein the first semiconductor layer is formed to have a first thickness at the temperature that the separation layer is formed, and to have a second thickness at a temperature higher than the temperature that the first thickness is formed.

2. The method according to claim 1, wherein the buffer layer is formed using the NH$_3$ gas.

3. The method according to claim 1, wherein the semiconductor layer is formed using a material containing a Group III element, a source gas formed by the HCl gas, and the NH$_3$ gas.

* * * * *